United States Patent
Boutros et al.

(10) Patent No.: US 6,635,507 B1
(45) Date of Patent: Oct. 21, 2003

(54) MONOLITHIC BYPASS-DIODE AND SOLAR-CELL STRING ASSEMBLY

(75) Inventors: Karim S. Boutros, Moorpark; Dmitri D. Krut, Encino; Nasser H. Karam, Northridge, all of CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/353,526

(22) Filed: Jul. 14, 1999

(51) Int. Cl.$^7$ ............................................. H01L 21/00
(52) U.S. Cl. ........................ 438/57; 438/59; 438/64; 438/66; 136/243; 136/244; 136/258
(58) Field of Search ................. 438/57, 58, 59, 438/64, 66; 136/243, 244, 258

(56) References Cited

U.S. PATENT DOCUMENTS

| | | | |
|---|---|---|---|
| 4,638,109 A | 1/1987 | Ishihara et al. | 136/244 |
| 4,759,803 A * | 7/1988 | Cohen | 136/244 |
| 4,997,491 A | 3/1991 | Hokuyo et al. | 136/255 |
| 5,248,346 A * | 9/1993 | Frass et al. | 13/244 |
| 5,261,969 A * | 11/1993 | Stanbery | 136/249 |
| 5,389,158 A * | 2/1995 | Frass et al. | 136/244 |
| 5,461,002 A * | 10/1995 | Safir | 437/160 |
| 5,580,395 A * | 12/1996 | Yoshioka et al. | 136/255 |
| 5,609,694 A * | 3/1997 | Asai | 136/255 |
| 5,616,185 A | 4/1997 | Kukulka | |
| 5,665,175 A * | 9/1997 | Safir | 136/255 |
| 5,990,415 A * | 11/1999 | Green et al. | 136/255 |

FOREIGN PATENT DOCUMENTS

| | | |
|---|---|---|
| EP | 0369666 | 5/1990 |
| EP | 0535614 | 4/1993 |
| JP | 57122580 | 7/1982 |
| JP | 61067968 | 4/1986 |
| JP | 02298080 | 12/1990 |
| WO | WO9962125 | 12/1999 |

* cited by examiner

Primary Examiner—Kamand Cuneo
Assistant Examiner—Asok Kumar Sarkar
(74) Attorney, Agent, or Firm—Gates & Cooper LLP

(57) ABSTRACT

An apparatus and method are described for making a solar cell with an integrated bypass diode. The method comprises the steps of depositing a second layer having a first type of dopant on a first layer having an opposite type of dopant to the first type of dopant to form a solar cell, depositing a third layer having the first type of dopant on the second layer, depositing a fourth layer having the opposite type of dopant on the third layer, the third layer and fourth layer forming a bypass diode, selectively etching the third layer and the fourth layer to expose the second layer and the third layer, and applying contacts to the fourth layer, third layer, and the first layer to allow electrical connections to the assembly. The apparatus comprises a first layer having a first type of dopant, a second layer having a second type of dopant opposite to the first type of dopant, wherein the first layer and the second layer form a solar cell, a third layer, coupled to the second layer, and a fourth layer, coupled to the third layer, the third layer and the fourth layer forming a bypass diode.

7 Claims, 8 Drawing Sheets

MONOLITHIC BYPASS-DIODE AND SOLAR-CELL STRING ASSEMBLY

BACKGROUND OF THE INVENTION

1. Field of the Invention

The present invention relates to devices and methods for making semiconductor devices, and in particular to a device and method for making monolithic bypass-diodes and solar-cell string assemblies.

2. Description of the Related Art

Solar cells are used in various technologies to provide power to other electronic assemblies. Satellites, calculators, and power systems are all examples of solar cell usage.

A solar cell is a p-n junction created over a large area on a semiconductor substrate. Solar cells are typically long-life devices, but can have their efficiency reduced or destroyed by reverse biasing of the solar cell junction. To prevent this type of damage, bypass diodes (BDs) are used to allow current to flow in an anti-parallel direction to the current flow through the solar cell junction.

Bypass diodes are typically formed using an isolated island structure and/or created in a recess of the back (reverse) of the solar cell substrate, and connected to the solar cell using additional wiring and/or additional metallization on the solar cell substrate. The use of additional wiring and/or additional metallization creates new failure points for solar cells, as well as adding to the weight and complexity of the solar cell structure. Additional weight and failure mechanisms are unacceptable in a spacecraft environment, because of the extreme additional costs involved. Further, additional metallization obscures the solar cell from receiving incident light, which reduces the efficiency of the solar cell structure.

FIGS. 1A–1B illustrate a related art device that integrates bypass diodes with solar cells.

FIG. 1A illustrates a cross-sectional view of a semiconductor device. Assembly 100 comprises solar cell 102 and bypass diode 104. Solar cell 102 utilizes an n-doped substrate 106 and a coupled p-doped layer 108. Substrate 106 and layer 108 are coupled electrically, such that a depletion layer is created between substrate 106 and layer 108. The method of coupling can be, for example, deposition of layer 108 on substrate 106, diffusion of p-type carriers into substrate 106 to form layer 108, chemical vapor deposition of layer 108, epitaxial growth of layer 108 on substrate 106, or other methods.

Bypass diode 104 utilizes a p-doped layer 110 and an n-doped layer 112 to create a separate p-n junction. Layer 110 is electrically coupled to substrate 106, and is isolated from layer 108 by a dielectric isolation layer 114. External connections 116 and 118 are complemented by metallization connections 120 and 122 to create the solar cell/bypass diode assembly 100. A more extensive description of the device illustrated in FIG. 1A can be found in U.S. Pat. No. 4,759,803, issued Jul. 26, 1988, which is herein incorporated by reference.

FIG. 1B illustrates a schematic diagram for assembly 100. Bypass diode 104 and solar cell 102 are connected in an anti-parallel configuration, with external connections 116 and 118 shown, in order to connect the assembly 100 to other assemblies 100.

The limitations of the assembly 100 shown in FIG. 1A is that there is a third p-n junction in the assembly, namely, that created by the coupling of layer 110 and substrate 106.

Further, the active area of the solar cell 102, shown as area 124, is reduced by the physical size of isolation layer 114 and the presence of bypass diode 104. Since the active area 124 of the solar cell is smaller than without bypass diode 104, a larger number of solar cells 102 will be required to produce a given amount of power. The assembly also uses a large metallization area, namely 120 and 122, which makes processing the assembly 100 more difficult, and reduces the yield because of the failures of the interconnections 120 and 122.

It can be seen that there is a need in the art for a solar cell that has an integrated bypass diode. It can also be seen that there is a need in the art for a solar cell that has a bypass diode that minimizes the need for additional wiring and/or metallization interconnects. It can also be seen that there is a need in the art for a bypass diode that minimizes the weight and failure points for solar cell devices.

SUMMARY OF THE INVENTION

To address the requirements described above, the present invention discloses a method, and apparatus for providing a bypass diode and solar cell string assembly. The assembly is monolithic and uses standardized semiconductor processing techniques to produce a bypass diode on the solar cell substrate.

The method comprises the steps of depositing a second layer having a first type of dopant on a first layer having an opposite type of dopant to the first type of dopant to form a solar cell, depositing a third layer having the first type of dopant on the second layer, depositing a fourth layer having the opposite type of dopant on the third layer, the third layer and fourth layer forming a bypass diode, selectively etching the third layer and the fourth layer to expose the second layer and the third layer, and applying contacts to the fourth layer, third layer, and the first layer to allow electrical connections to the assembly.

The apparatus comprises a first layer having a first type of dopant, a second layer having a second type of dopant opposite to the first type of dopant, wherein the first layer and the second layer form a solar cell, a third layer, coupled to the second layer, and a fourth layer, coupled to the third layer, the third layer and the fourth layer forming a bypass diode.

The present invention provides a solar cell that has an integrated bypass diode. The present invention also provides a solar cell that has a bypass diode that minimizes the need for additional wiring and/or metallization interconnects, as well as minimizing the weight and failure points for solar cell devices.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

The present invention monolithically incorporates a bypass diode into a solar cell assembly. The present invention creates the bypass diode without complex processing steps, which increases the yield for the finished device.

Related art processes, such as those described in U. S. Pat. No. 5,616,185, entitled "SOLAR CELL WITH INTEGRATED BYPASS DIODE AND METHOD," describe using a discrete bypass diode that is integrated with the solar cell as a hybrid assembly. The bypass diode is integrated with the solar cell by forming recesses on the non-illuminated side of the solar cell and placing at least one discrete low-profile bypass diode in the recesses so that each bypass diode is approximately flush with the back side of the solar cell. Each bypass diode is then bonded to the solar cell for anti-parallel connection across the solar cell.

The back side of the solar cell is preferably formed with a honeycomb pattern of recesses to reduce the weight of the solar cell while maintaining mechanical strength. The recesses that receive bypass diodes preferably have a rectangular shape that better accommodates the bypass diode.

This related art technique makes the solar cell difficult to make, because the rear of the solar cell must be patterned and etched to receive the bypass diodes, and the bypass diodes must then be electrically connected to the solar cells. These additional process steps are costly and provide additional failure mechanisms for the completed assembly.

Figure 1A:
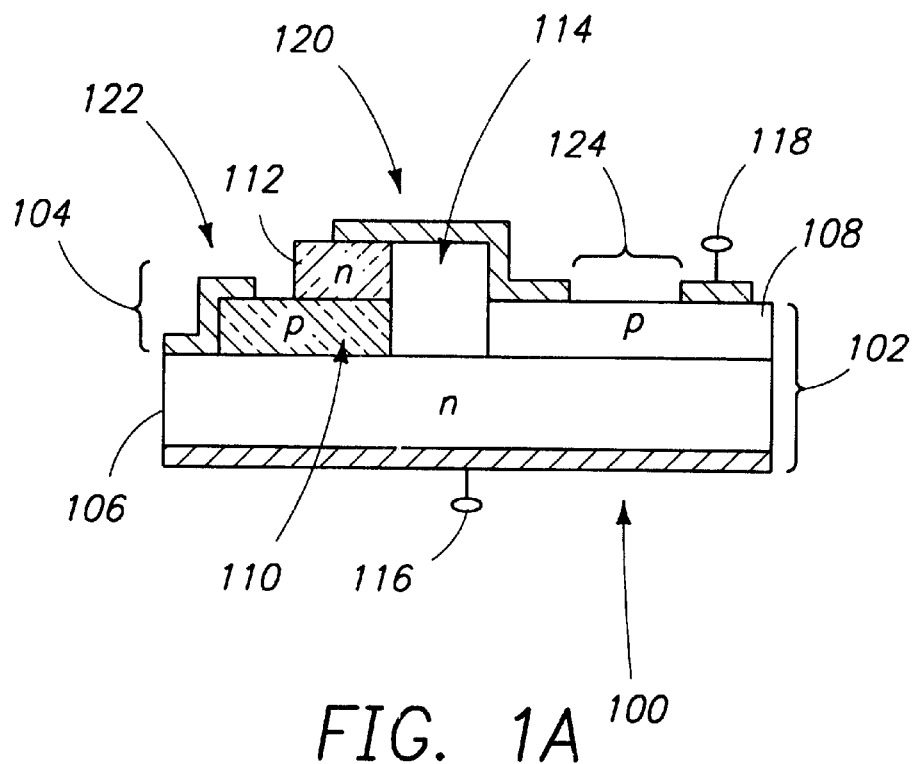
FIGS. 1A–1B illustrate a related art device that integrates bypass diodes with solar cells.
Figure 1B:
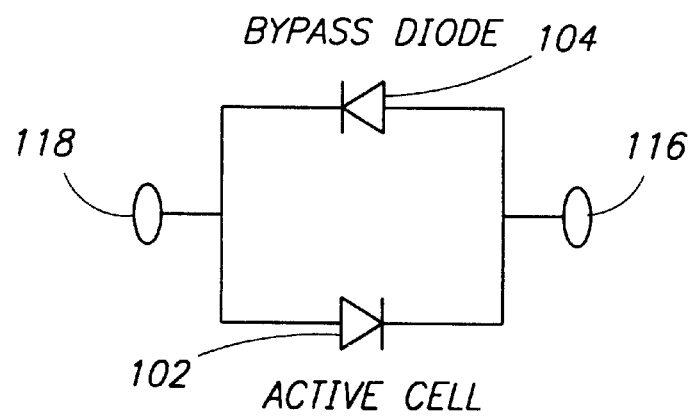
Figure 2A:
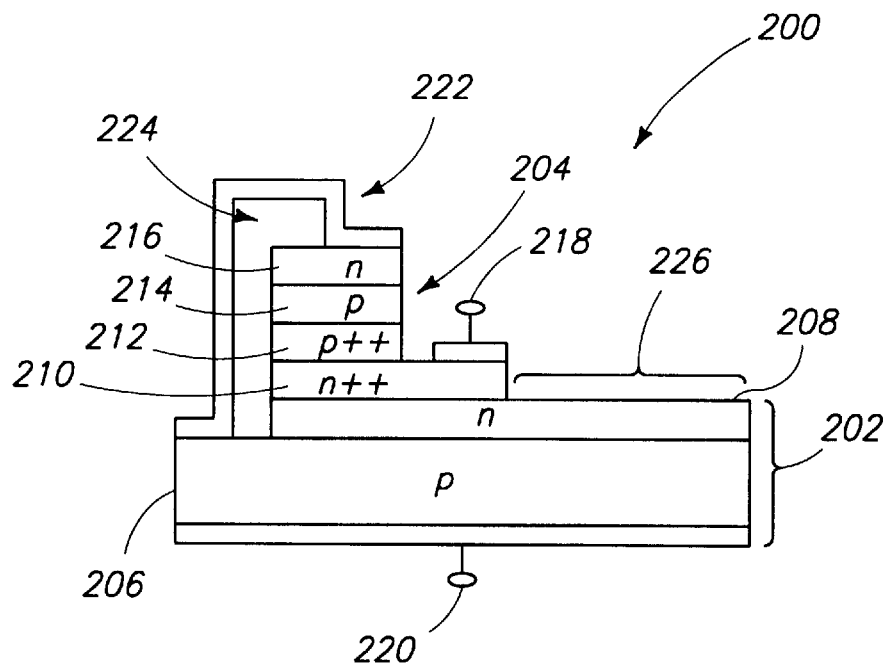
FIGS. 2A–2B illustrate a device in accordance with the present invention that integrates bypass diodes with solar cells.
Figure 2B:
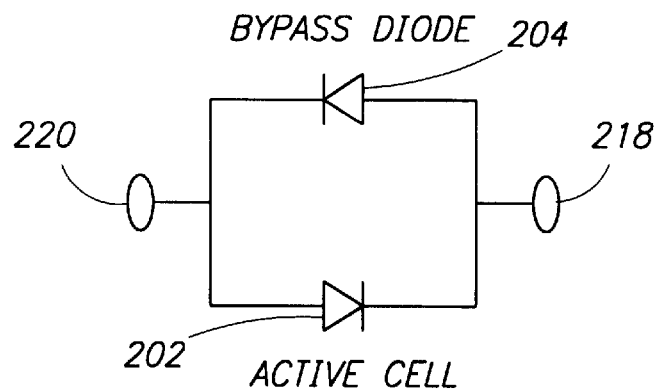

FIGS. 2A–2B illustrate a device in accordance with the present invention that integrates bypass diodes with solar cells.

FIG. 2A shows assembly 200, comprising solar cell 202 and bypass diode 204. Solar cell 202 utilizes an p-doped substrate 206 and a coupled n-doped layer 208. Although substrate 206 is shown as a wafer, substrate 206 can be a dopant well within a wafer, an isolated structure on top of a wafer, a layer or other structure, and is not limited to the wafer structure illustrated in FIG. 2A. Further, solar cell 202, although shown as a single junction cell, can be a two junction solar cell 202, a three junction solar cell 202, or an n-junction solar cell 202, where n is any number. The present invention is not limited to single junction solar cells 202.

Substrate 206 and layer 208 are coupled electrically, such that a depletion layer is created between substrate 206 and layer 208. The method of coupling can be, for example, deposition of layer 208 on substrate 206, diffusion of n-type carriers into substrate 206 to form layer 208, chemical vapor deposition of layer 208, epitaxial growth of layer 208 on substrate 206, or other methods. Substrate 206 is typically germanium, but can comprise other materials such as silicon, indium phosphide (InP), gallium arsenide (GaAs), gallium phosphide (GaP), gallium indium phosphide (GaInP), or other materials.

Bypass diode 204 comprises a multilayer diode structure, having layers 210–216. Layer 210 is a highly n-doped (n++) layer, and is coupled to layer 208. Layer 212 is a highly p-doped (p++) layer, layer 214 is a p-doped layer, and layer 216 is an n-doped layer. Layer 210 is used as a tunnel junction to connect to contact 218. Layers 214 and 216 create a p-n junction, and comprise the bypass diode 204. Although a single bypass diode 204 is shown, the present invention envisions multiple bypass diodes 204 manufactured for a given solar cell 202. Multiple bypass diodes 204 provide redundancy for a solar cell 202. Bypass diode 204 is typically gallium arsenide or a III–V semiconductor structure, such as alloys of gallium, indium, and aluminum with arsenic, phosphorous, and antimony, but can also be silicon, germanium, combinations of silicon and germanium with or without carbon, II–VI semiconductor materials, other ternary or quaternary combinations of semiconductor materials, or other materials.

Electrical contact 220 is coupled to substrate 206, and electrical interconnect 222 is deposited on isolation layer 224 such that electrical interconnect 222 couples layer 216 with substrate 206. Substrate 206 has a low electrical resistivity, and, as such, electrical interconnect 222 is effectively coupled to the electrical contact 220 on the bottom (back) of substrate 206. Alternatively, electrical interconnect 222 can be formed using a wrap-around tab contact to connect layer 216 to substrate 206. Isolation layer 224 can be formed by hard dielectrics, such as oxides and nitrides, or by soft dielectrics, such as polyimides, or other methods.

The layers 208–216, contacts 218–220, and interconnect 222 are defined lithographically and etched using any standard etching method to determine the geometric shapes desired for each of the elements of the assembly 200. Although not shown, additional layers can be used to assist in the photolithographic and/or manufacturing processes, such as stop etch layers, etc., which are additional layers within the assembly 200 that control the etching of specific areas of the assembly 200.

Active area 226 for solar cell 202, as compared to area 124, is now much larger, which results in a solar cell 202 that can generate more power for a given area. Further, the assembly 200 can be made using standard fabrication techniques, and does not require etching or other removal of material from the back of the solar cell 202 to install hybrid discrete bypass diodes 204. Although discussed with respect to a p-doped substrate 206, an n-doped substrate 206, with appropriately doped layers 208–214, can also be used in accordance with the present invention.

FIG. 2B illustrates a schematic diagram for assembly 200. Bypass diode 204 and solar cell 202 are connected in an anti-parallel configuration, with external connections 218 and 220 shown, in order to connect the assembly 200 to other assemblies 200.

Figure 3A:
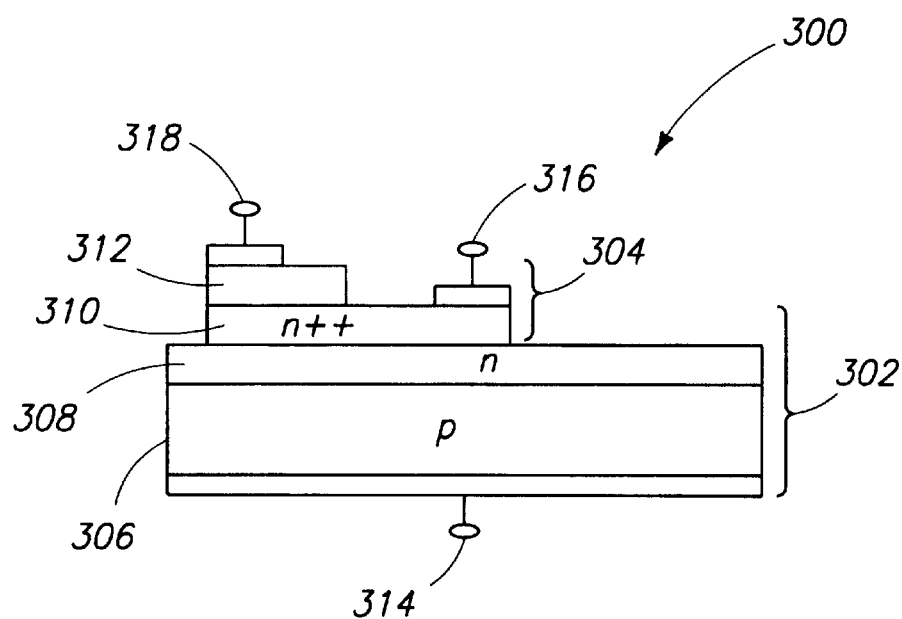
FIGS. 3A–3B illustrate an alternative embodiment and alternative schematic of the solar cell assembly of the present invention.
Figure 3B:
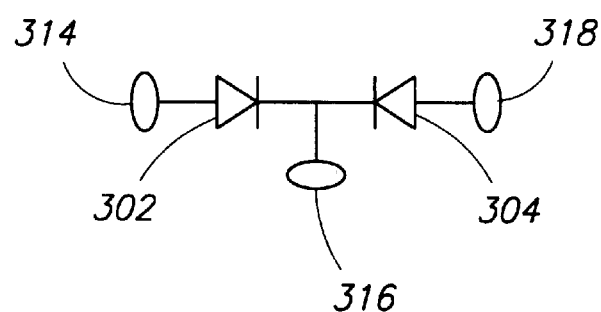

FIGS. 3A–3B illustrate an alternative embodiment and alternative schematic of the solar cell assembly of the present invention.

FIG. 3A shows assembly 300, comprising solar cell 302 and bypass diode 304. Solar cell 302 utilizes an p-doped substrate 306 and a coupled n-doped layer 308. Substrate 306 and layer 308 are coupled electrically, such that a depletion layer is created between substrate 306 and layer 308. The method of coupling can be, for example, deposition of layer 308 on substrate 306, diffusion of n-type carriers into substrate 306 to form layer 308, chemical vapor deposition of layer 308, epitaxial growth of layer 308 on substrate 306, or other methods. Substrate 306 is typically germanium, but can comprise other materials such as silicon, indium phosphide (InP), gallium arsenide (GaAs), gallium phosphide (GaP), gallium indium phosphide (GaInP), or other materials.

Although substrate 306 is shown as a wafer, substrate 306 can be a dopant well within a wafer, an isolated structure on top of a wafer, a layer or other structure, and is not limited to the wafer structure illustrated in FIG. 3A. Further, solar cell 302, although shown as a single junction cell, can be a two junction solar cell 302, a three junction solar cell 302, or an n-junction solar cell 302, where n is any number. The present invention is not limited to single junction solar cells 302.

Bypass diode 304 comprises layers 310–312. Layer 310 is a highly n-doped (n++) layer, and is coupled to layer 308. Layer 312 is a p-doped layer and is coupled to layer 310. Although a single bypass diode 304 is shown, the present invention envisions multiple bypass diodes 304 manufactured for a given solar cell 302. Multiple bypass diodes 304 provide redundancy for a solar cell 302. Bypass diode 304 is typically gallium arsenide or a III–V semiconductor structure such as alloys of gallium, indium, and aluminum with arsenic, phosphorous, and antimony, but can also be silicon, germanium, combinations of silicon and germanium with or without carbon, II–VI semiconductor materials, ternary or quaternary combinations of semiconductor materials, or other materials.

The structure of assembly 300 contains three contacts, namely contacts 314–318. Assembly 300 now only involves the deposition of a single layer, namely layer 312, to create the bypass diode 304. Etching and photolithographical techniques then define the layers 306–312 for proper attachment of the contacts 314–318. The simpler processing steps used to create the assembly 300 of the present invention increases the yield for the devices, and also reduces costs during the production run for assembly 300. Although not shown, additional layers can be used to assist in the photolithographic and/or manufacturing processes, such as stop etch layers, etc., which are additional layers within the assembly 300 that control the etching of specific areas of the assembly 300. Although discussed with respect to a p-doped substrate 306, an n-doped substrate 306, with appropriately doped layers 308–312, can also be used in accordance with the present invention.

FIG. 3B is a schematic diagram for the assembly 300 illustrated in FIG. 3A. Since there are now three contacts 314–318, solar cell 302 and bypass diode 304 are no longer connected in an anti-parallel technique as in the assemblies 100 and 200. However, bypass diode 304 for a given solar cell 302 is connected to a solar cell of a different assembly 300 to create the anti-parallel connections required to provide the reverse bias protection for the assembly 300. The connection for such a structure is discussed with respect to FIG. 5.

Figure 4A:
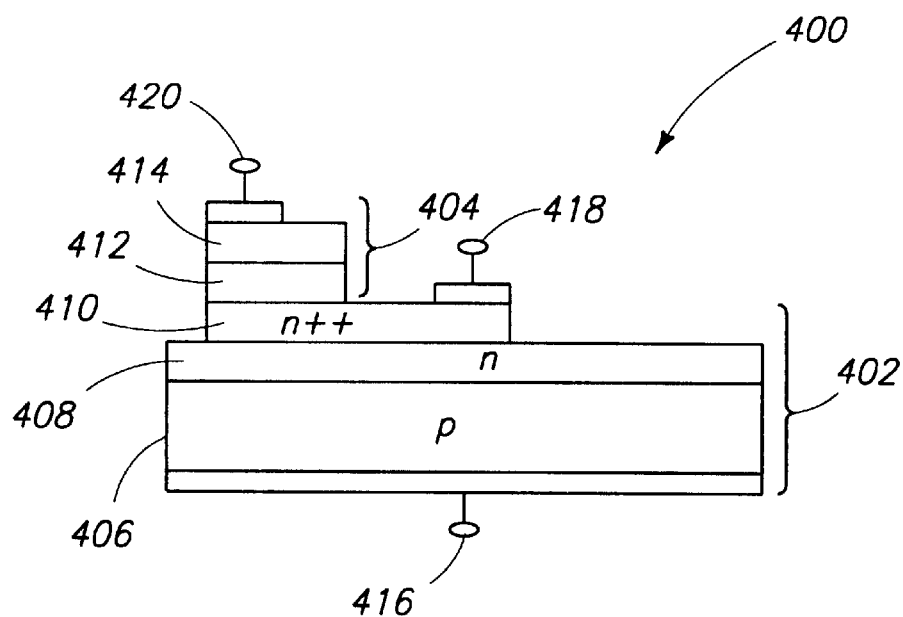
FIGS. 4A–4B illustrate an alternative embodiment and alternative schematic of the solar cell assembly of the present invention.
Figure 4B:
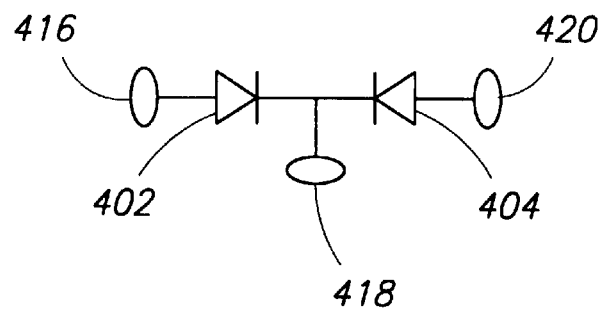

FIGS. 4A–4B illustrate an alternative embodiment and alternative schematic of the solar cell assembly of the present invention.

FIG. 4A shows assembly 400, comprising solar cell 402 and bypass diode 404. Solar cell 402 utilizes an p-doped substrate 406 and a coupled n-doped layer 408. Substrate 406 and layer 408 are coupled electrically, such that a depletion layer is created between substrate 406 and layer 408. The method of coupling can be, for example, deposition of layer 408 on substrate 406, diffusion of n-type carriers into substrate 406 to form layer 408, chemical vapor deposition of layer 408, epitaxial growth of layer 408 on substrate 406, or other methods. Substrate 406 is typically germanium, but can comprise other materials such as silicon, indium phosphide (InP), gallium arsenide (GaAs), gallium phosphide (GaP), gallium indium phosphide (GaInP), or other materials.

Although substrate 406 is shown as a wafer, substrate 406 can be a dopant well within a wafer, an isolated structure on top of a wafer, a layer or other structure, and is not limited to the wafer structure illustrated in FIG. 4A. Further, solar cell 402, although shown as a single junction cell, can be a two junction solar cell 402, a three junction solar cell 402, or an n-junction solar cell 402, where n is any number. The present invention is not limited to single junction solar cells 402.

Bypass diode 404 comprises layers 410–414. Layer 410 is a highly n-doped (n++) layer, and is coupled to layer 408. Layer 412 is an n-doped layer and is coupled to layer 410 and layer 414 is an p-doped layer and is coupled to layer 412. Layers 412–414 create a p-n junction, and comprise the bypass diode 404. Bypass diode 404 is typically gallium arsenide or a III–V semiconductor structure such as alloys of gallium, indium, and aluminum with arsenic, phosphorous, and antimony, but can also be silicon, germanium, combinations of silicon and germanium with or without carbon, II–VI semiconductor materials, ternary or quaternary combinations of semiconductor materials, or other materials.

The structure of assembly 400 contains three contacts, namely contacts 416–420. Assembly 400 now only involves the deposition of a two additional layers, namely layers 412 and 414, to create the bypass diode 404. Etching and photolithographical techniques then define the layers 406–414 for proper attachment of the contacts 416–420. The simpler processing steps used to create the assembly 400 of the present invention increases the yield for the devices, and also reduces costs during the production run for assembly 300. Layer 414 contains a lower dopant density (p instead of p++) to provide a lower leakage current in the bypass diode 404, which increases the efficiency of the overall assembly 400. Although discussed with respect to a p-doped substrate 406, an n-doped substrate 406, with appropriately doped layers 408–414, can also be used in accordance with the present invention.

FIG. 4B is a schematic diagram for the assembly 400 illustrated in FIG. 4A. Since there are now three contacts 416–420, solar cell 402 and bypass diode 404 are no longer connected in an anti-parallel technique as in the assemblies 100 and 200. However, bypass diode 404 for a given solar cell 402 is connected to a solar cell of a different assembly 400 to create the anti-parallel connections required to provide the reverse bias protection for the assembly 400. The connection for such a structure is discussed with respect to FIG. 5.

Figure 5:
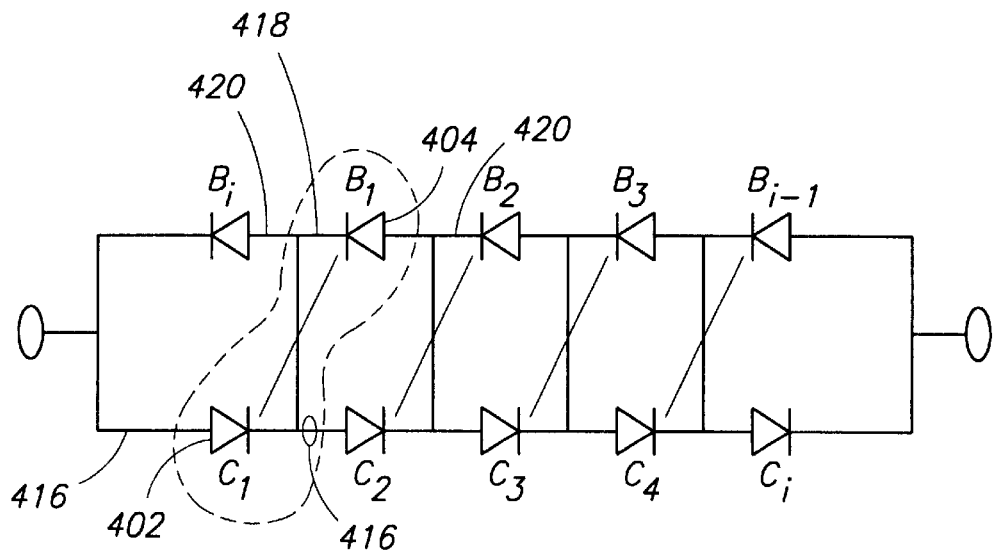
FIG. 5 illustrates a connection strategy for the devices made as described in FIGS. 3A and 4A.

FIG. 5 illustrates a connection strategy for the devices made as described in FIGS. 3A and 4A. A series of a number (i) assemblies 400, or alternatively, 300, are connected as shown in FIG. 5. Each assembly 400 is numbered, e.g., 1, 2, . . . i. The contact 418 of the first assembly is coupled to contact 416 of the second assembly 400, which electrically connects the cathode of solar cell 402 and the anode of bypass diode 404 of the first assembly 400 to the anode of solar cell 402 of the second assembly. This approach allows for a ladder-like connection of the solar cells 402 and the bypass diodes 404 for all of the assemblies 400, such that each bypass diode 404 protects the solar cell 402 of the assembly 400 adjacent. Further, the first assembly 400 and the ith assembly 400 can be connected as shown in FIG. 5, such that the ith bypass diode 404 protects the first solar cell 402. If desired, the ith bypass diode 404 can also protect a different solar cell 402, e.g., a solar cell 402 in a different series string of assemblies 400. The interconnect schema shown in FIG. 5 provides protection for each solar cell 400 in the string of solar cells 402. This type of interconnection, along with the assembly structure shown in FIGS. 3A and 4A, eliminates the isolation requirement within each assembly 300 and 400, thus decreasing the complexity of the manufacture of the assemblies 300 and 400.

Figure 6:
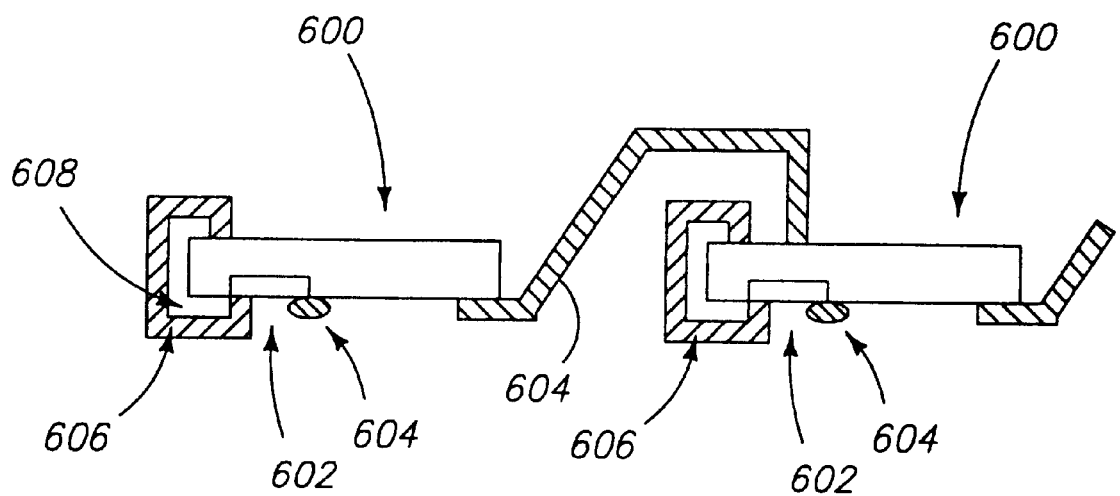
FIG. 6 illustrates the interconnection schema required by the related art.

FIG. 6 illustrates the interconnection schema required by the related art.

Solar cells 600 and bypass diodes 602 are physically connected by mounting bypass diodes 602 on the rear (non-illuminated) portion of solar cells 600. String connection 604 couples one solar cell 600 to another solar cell 600, which places solar cells 600 in a series connection to produced a desired output voltage from solar cells 600. To connect bypass diode 602 to solar cell 600, solder contact 604 and wrap-around connection 606 must be used to electrically connect the bypass diode 604 to the solar cell 600. Further, to properly form wrap-around connection 606, insulator 608 must be positioned to prevent electrical shorting between the layers within solar cell 600 and the layers of bypass diode 602. Additional information regarding the solar cells 600 and bypass diodes 602 shown in FIG. 6 can be found in commonly assigned U.S. Pat. No. 5,616,185, issued Apr. 1, 1997, which is hereby incorporated by reference.

Figure 7:
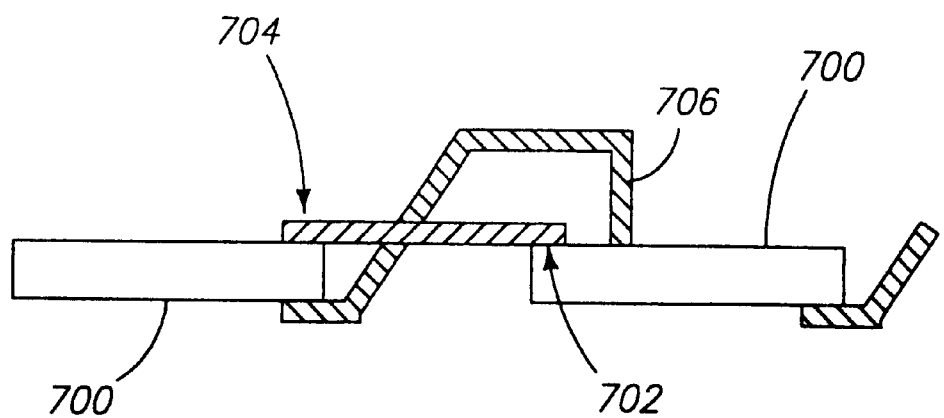
FIG. 7 illustrates the interconnection schema used by the present invention.

FIG. 7 illustrates the interconnection schema used by the present invention. The embodiment of the present invention shown in FIG. 2 does not require the bypass diode to be connected externally to the solar cell, since metallization on the assembly connects the bypass diode to the solar cell properly. For the embodiments of the present invention shown in FIGS. 3 and 4, solar cell 700 and bypass diode 702 are connected using contact 704. String connection 706 is again used to series connect one solar cell 700 to another solar cell 700 to produce the proper voltage for the string. The present invention eliminates the need for solder connections between the bypass diode 702 and the solar cell 700, as well as the insulator and wrap-around connection required by the related art. The elimination of these elements makes the assembly easier to produce and integrate into a final assembly.

Figure 8:
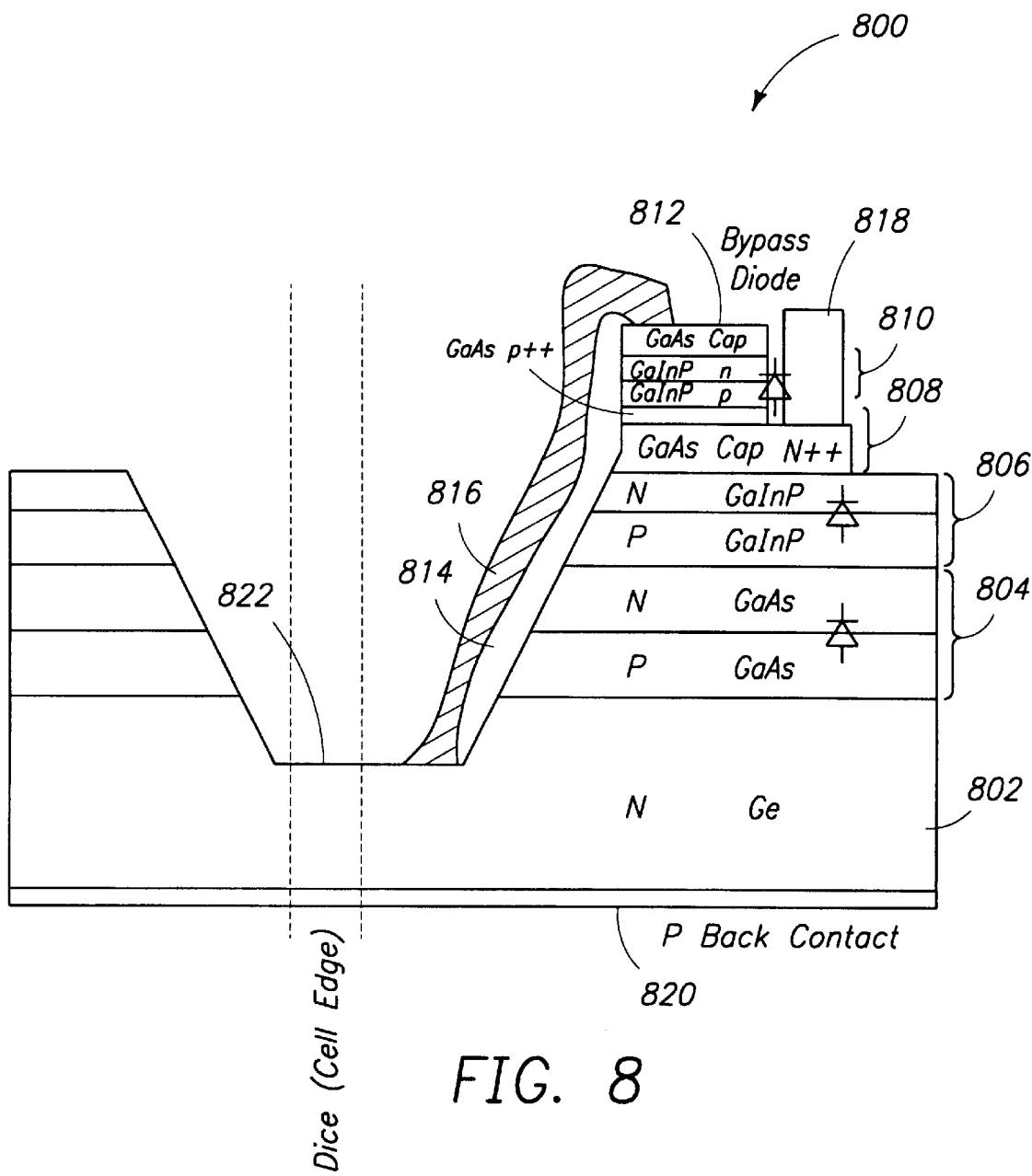
FIG. 8 illustrates a completed structure in accordance with the present invention.

FIG. 8 illustrates a completed structure in accordance with the present invention. Assembly 800 comprises substrate 802, solar cell 804, solar cell 806, isolation layer 808, bypass diode 810, and contact layer 812. Isolation layer 814 and contacts 816–820 complete the structure. Dice line 822 is created to separate assembly 800 from other assemblies 800 on substrate 802.

The solar cells 804 and 806 are shown as being formed of different materials, e.g., solar cell 804 is formed out of GaAs, whereas solar cell 806 is formed out of GaInP. However, solar cells 804 and 806 can be formed of the same materials, or other materials than shown in FIG. 8, without departing from the scope of the present invention. Further, the isolation layer 808 is not required, as discussed with respect to FIG. 3A.

Although bypass diode 810 can be formed anywhere on the assembly 800, placing bypass diode 810 near the edge of the cell, e.g., near dice line 822, simplifies the assembly 800 contact 816–820 formation.

Figure 9:
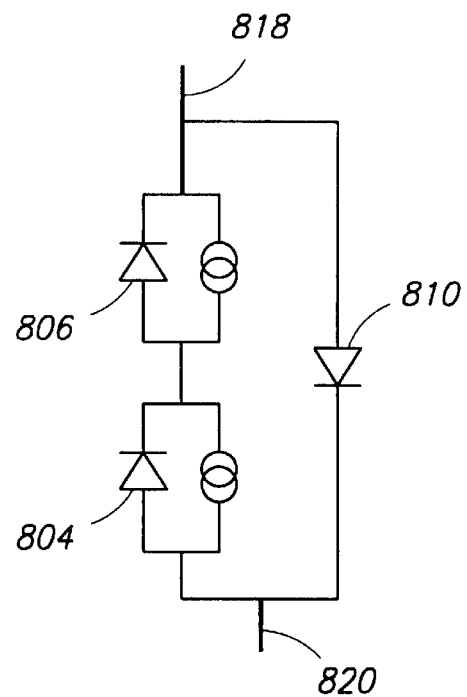
FIG. 9 illustrates a schematic for the structure described in FIG. 8.

FIG. 9 illustrates a schematic for the structure described in FIG. 8. As shown, bypass diode 810 is connected in an anti-parallel configuration with the series connection of solar cells 804 and 806.

Process Chart

Figure 10:
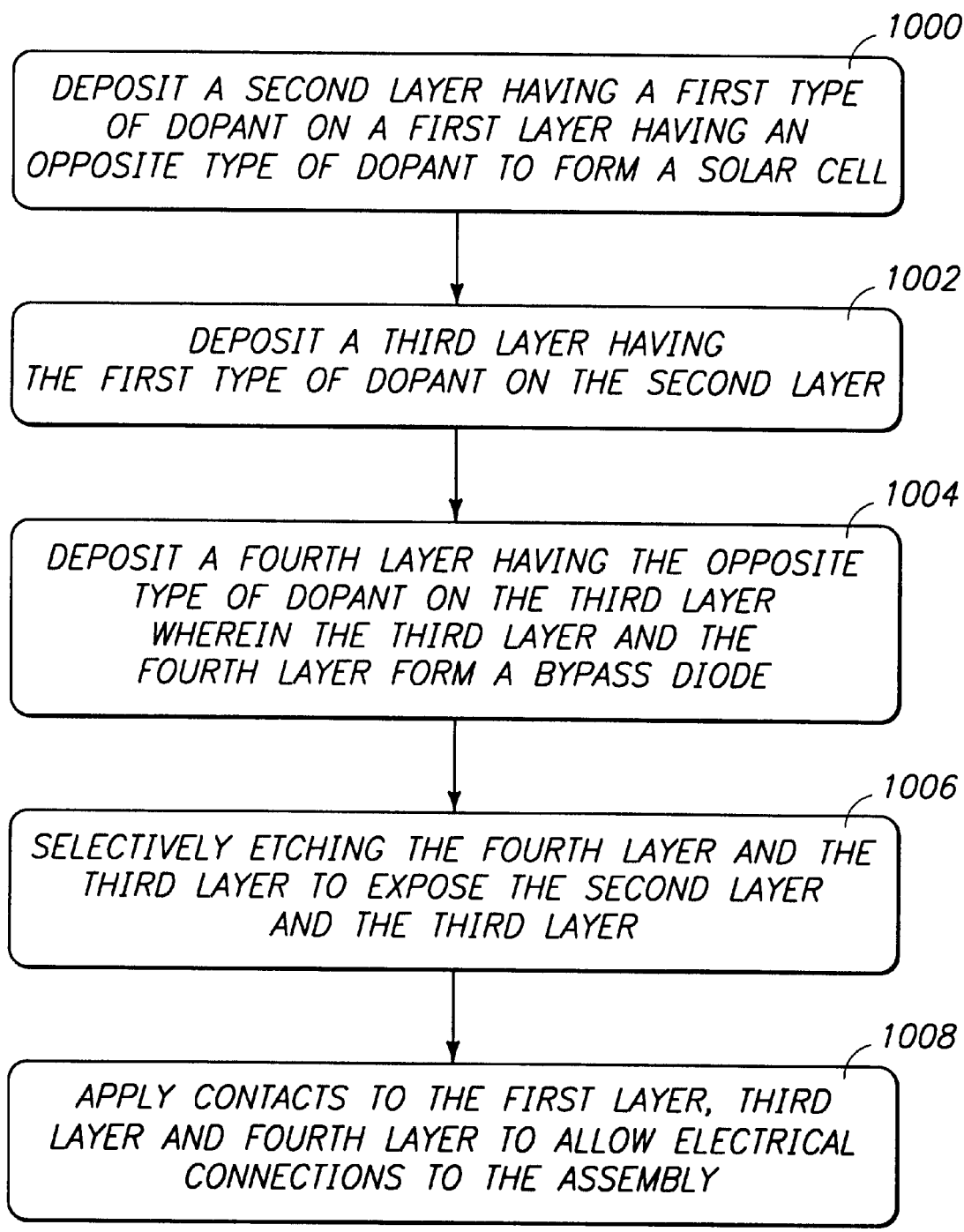
FIG. 10 is a flow chart showing the operations used to practice one embodiment of the present invention.

FIG. 10 is a flow chart showing the operations used to practice one embodiment of the present invention.

Block 1000 represents performing the step of depositing a second layer having a first type of dopant on a first layer having an opposite type of dopant to the first type of dopant to form a solar cell.

Block 1002 represents performing the step of depositing a third layer having the first type of dopant on the second layer.

Block 1004 represents performing the step of depositing a fourth layer having the opposite type of dopant on the third layer, the third layer and fourth layer forming a bypass diode.

Block 1006 represents performing the step of selectively etching the third layer and the fourth layer to expose the second layer and the third layer.

Block 1008 represents performing the step of applying contacts to the fourth layer, third layer, and the first layer to allow electrical connections to the assembly.

Conclusion

This concludes the description of the preferred embodiments of the present invention. In summary, the present invention describes an apparatus and method for making a monolithic bypass diode and solar cell assembly. Although described herein using a single junction solar cell, the present invention can be used with solar cells having any number of junctions. The method comprises the steps of depositing a second layer having a first type of dopant on a first layer having an opposite type of dopant to the first type of dopant to form a solar cell, depositing a third layer having the first type of dopant on the second layer, depositing a fourth layer having the opposite type of dopant on the third layer, the third layer and fourth layer forming a bypass diode, selectively etching the third layer and the fourth layer to expose the second layer and the third layer, and applying contacts to the fourth layer, third layer, and the first layer to allow electrical connections to the assembly. The apparatus comprises a first layer having a first type of dopant, a second layer having a second type of dopant opposite to the first type of dopant, wherein the first layer and the second layer form a solar cell, a third layer, coupled to the second layer, and a fourth layer, coupled to the third layer, the third layer and the fourth layer forming a bypass diode.

The foregoing description of the preferred embodiment of the invention has been presented for the purposes of illustration and description. It is not intended to be exhaustive or to limit the invention to the precise form disclosed. Many modifications and variations are possible in light of the above teaching. For example, the bypass diode can be placed under the contact pad of the solar cell instead of in a separate mesa structure as illustrated. Further, some or all of the contacts between the solar cell and the bypass diode can be made using external or mechanical means instead of metallization steps. It is intended that the scope of the invention be limited not by this detailed description, but rather by the claims appended hereto.

What is claimed is:

1. A solar cell assembly, comprising:
    a solar cell having a first anode and first cathode, wherein the first cathode is connected to a first contact adapted to be connected to a first different solar cell; and
    an integrated bypass diode monolithically integrated to a front side of the solar cell and having a second anode and a second cathode, wherein the second cathode is connected to a second contact adapted to be connected to a second different solar cell;

wherein the first anode and the second anode are connected at a highly doped front side layer to a third contact adapted to be connected to the second different solar cell; and wherein the integrated bypass diode is monolithically integrated to the front side of the solar cell such that the first anode and the second anode are formed of proximate semiconductor layers.

2. The solar cell assembly of claim 1, interconnected with a plurality of like solar cell assemblies such that the bypass diode of one solar cell protects another solar cell.

3. The solar cell assembly of claim 2, wherein the bypass diode of one solar cell protects the adjacent solar cell.

4. A method of connecting solar cell assemblies, comprising:

connecting a first cell cathode of a first solar cell and a first diode anode of a first bypass diode, both of a first solar cell assembly, to a second cell anode of a second solar cell of a second solar cell assembly; and connecting a first diode cathode of the first bypass diode of the first solar cell assembly, to a second cell cathode of the second solar cell and a first diode anode of a second bypass diode, both of the second solar cell assembly.

5. A solar cell assembly, comprising:

a solar cell having a first cathode and first anode, wherein the first anode is connected to a first contact adapted to be connected to a first different solar cell;

an integrated bypass diode monolithically integrated to a front side of the solar cell and having a second cathode and a second anode, wherein the second anode is connected to a second contact adapted to be connected to a second different solar cell;

wherein the first cathode and the second cathode are connected at a highly doped front side layer to a third contact adapted to be connected to the second different solar cell; and wherein the integrated bypass diode is monolithically integrated to the front side of the solar cell such that the first cathode and the second cathode are formed of proximate semiconductor layers.

6. The solar cell assembly of claim 5, interconnected with a plurality of like solar cell assemblies such that the bypass diode of one solar cell protects another solar cell.

7. The solar cell assembly of claim 6, wherein the bypass diode of one solar cell protects the adjacent solar cell.

* * * * *